United States Patent
Kim et al.

(10) Patent No.: US 7,751,271 B2
(45) Date of Patent: Jul. 6, 2010

(54) SEMICONDUCTOR MEMORY DEVICE (75) Inventors: Dong-Keun Kim, Kyoungki-do (KR);
Seung-Lo Kim, Kyoungki-do (KR)

(73) Assignee: Hynix Semiconductor Inc.,
Kyoungki-do (KR)

( * ) Notice: Subject to any disclaimer, the term of this patent is extended or adjusted under 35 U.S.C. 154(b) by 213 days.

(21) Appl. No.: 12/005,915

(22) Filed: Dec. 28, 2007

(65) Prior Publication Data

US 2009/0059694 A1    Mar. 5, 2009

(30) Foreign Application Priority Data

Sep. 3, 2007    (KR) ............... 10-2007-0088929

(51) Int. Cl.
*G11C 8/00* (2006.01)
(52) U.S. Cl. .................. 365/230.03; 365/194
(58) Field of Classification Search .......... 365/230.03, 365/194, 203, 233.1
See application file for complete search history.

(56) References Cited

U.S. PATENT DOCUMENTS

| | | | | | |
|---|---|---|---|---|---|
| 5,973,990 | A | * | 10/1999 | Sakurai | 365/233.1 |
| 7,433,261 | B2 | * | 10/2008 | Freebern et al. | 365/230.08 |
| 2008/0159024 | A1 | * | 7/2008 | Park | 365/194 |

FOREIGN PATENT DOCUMENTS

| | | |
|---|---|---|
| JP | 11-203867 | 7/1999 |
| JP | 2000-251469 | 9/2000 |
| KR | 2002-0042030 | 6/2002 |
| KR | 2003-0051975 | 6/2003 |

* cited by examiner

*Primary Examiner*—Anh Phung
(74) *Attorney, Agent, or Firm*—Blakely, Sokoloff, Taylor & Zafman LLP (57)    ABSTRACT

A semiconductor memory device includes: a reference signal delay unit configured to delay a reference signal for a predetermined operation to output a delayed reference signal; an address delay unit configured to delay a bank address to output a delayed bank address; and a decoding unit configured to receive the delayed reference signal to output a signal for determining a timing of a predetermined operation on a bank selected by the delayed bank address.

7 Claims, 7 Drawing Sheets

SEMICONDUCTOR MEMORY DEVICE

CROSS-REFERENCE TO RELATED APPLICATIONS

The present invention claims priority of Korean patent application number 10-2007-0088929, filed on Sep. 3, 2007, which is incorporated by reference in its entirety.

BACKGROUND OF THE INVENTION

The present invention relates to a semiconductor memory device, and more particularly, to a semiconductor memory device having an integrated delay circuit instead of a plurality of delay circuits corresponding to respective banks in order to reduce its size.

A semiconductor memory device includes a bank for storing data, a peri region for controlling the bank and performing a read/write operation and a power circuit.

The bank is formed by partitioning a data storage region of the semiconductor memory device into a predetermined size for an efficient use of the data. A single chip may have a plurality of banks. The bank includes a cell for storing data allocated to its X and Y addresses and a controller with an X and Y decoders.

A typical semiconductor memory device includes various delay circuits for various purposes in order to control a lot of banks. It includes as many delay circuits for controlling the banks as the number of banks.

Figure 1:
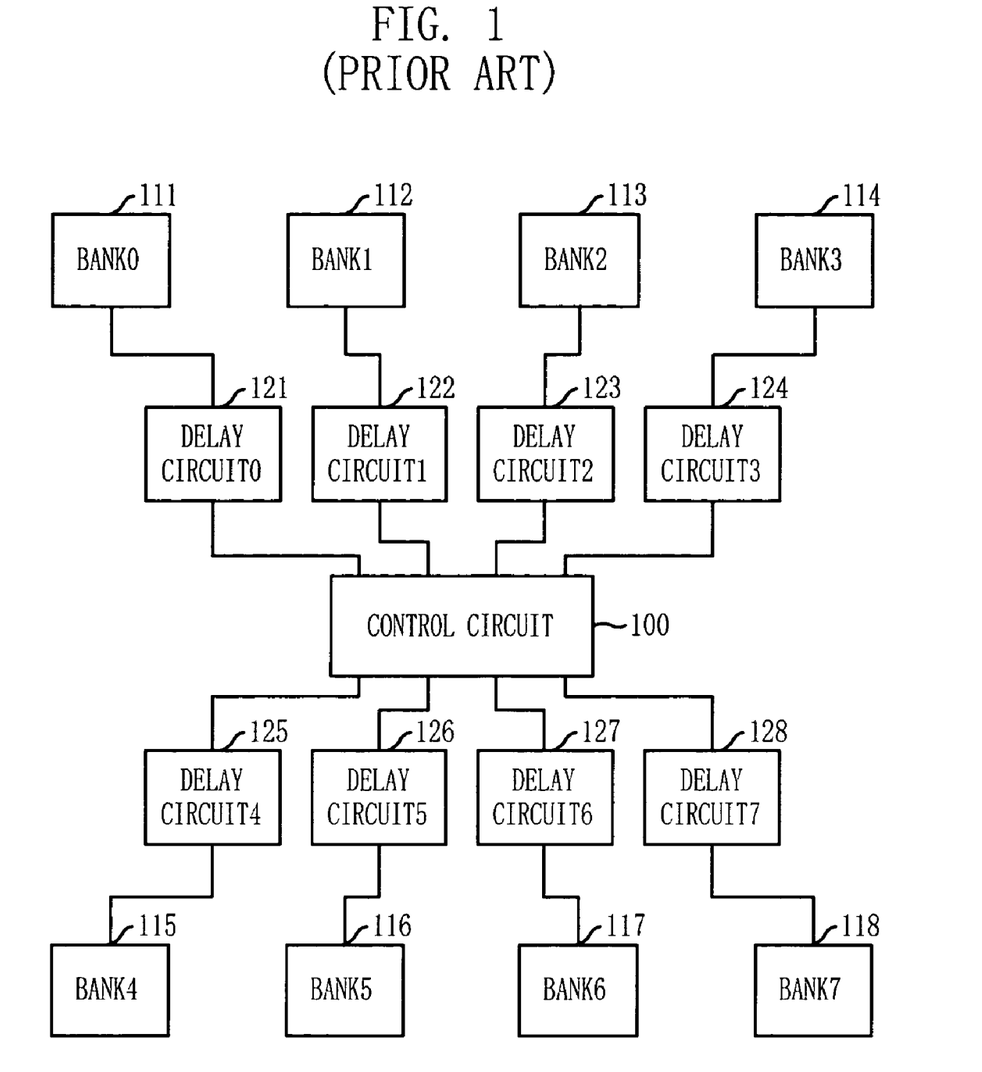
FIG. 1 is a block diagram of a typical semiconductor memory device.

FIG. 1 is a schematic block diagram of a typical semiconductor memory device.

Referring to FIG. 1, the typical semiconductor memory device includes banks 111, 112, 113, 114, 115, 116, 117 and 118, a control circuit 100 for controlling the banks 111 through 117 and delay circuits 121, 122, 123, 124, 125, 126, 127 and 128, corresponding to the respective banks 111 through 117. The control circuit 100 includes a peri block, a power circuit and other circuits for controlling operation of the bank. The delay circuits 121 through 128 adjust timings of operations of the banks 111 through 118.

Hereinafter, operations of the delay circuits 121 through 128 corresponding to the respective banks 111 through 118 in a refresh mode will be described for example.

As is well known, the semiconductor memory device may perform auto/self refresh operations, and the refresh operation includes an active operation and a precharge operation. A precharge reference signal for the precharge operation of each of the banks 111 through 118 is not generated by the control circuit 100 whereas an active reference signal for the active operation is generated by the control circuit 100 in response to an external command and the like. Instead, each bank generates its precharge reference signal by delaying its active reference signal by a predetermined time interval. For this, the semiconductor memory device includes a plurality of delay circuits 121 through 128 corresponding to the respective banks 111 through 118.

The semiconductor memory device may include a lot of delay circuits adjusting timings of various operations of the respective banks 111 through 118. As the memory capacity increases and the number of banks increases, the number of delay circuits also needs to be increased, which is becoming a burden on chip size of the semiconductor memory device. A delay circuit, such as an RC delay circuit, which needs a great area further increases such a burden.

SUMMARY OF THE INVENTION

Embodiments of the present invention are directed to providing a semiconductor memory device having an integrated delay circuit instead of a plurality of delay circuits corresponding to respective banks in order to reduce its size.

In accordance with a first aspect of the present invention, there is provided a semiconductor memory device, including: a reference signal delay unit configured to delay a reference signal for a predetermined operation to output a delayed reference signal; an address delay unit configured to delay a bank address to output a delayed bank address; and a decoding unit configured to receive the delayed reference signal to output a signal for determining a timing of a predetermined operation on a bank selected by the delayed bank address.

That is, the common reference signal for the predetermined operations performed by respective banks is delayed. The bank is selected by the bank address delayed with the reference signal. The delayed reference signal is used as the reference signal for the predetermined operation of the selected bank. Accordingly, it is not necessary that a plurality of delay units corresponding to the respective banks be provided, and thus the size of the semiconductor memory device can be reduced.

In accordance with a second aspect of the present invention, there is provided a semiconductor memory device, including: a reference signal delay unit configured to delay an active signal to output a delayed active signal; an address delay unit configured to delay a bank address to output a delayed bank address; and a decoding unit configured to receive the delayed active signal to output a precharge signal for a bank selected by the delayed bank address.

Because each bank needs a precharge signal which serves as a reference signal in determining a precharge timing and the precharge is performed at a predetermined time duration after an active operation, the precharge signal is generated by delaying the active signal. The typical semiconductor memory device includes a plurality of delay units corresponding to respective banks to generate the precharge signal corresponding to the respective banks. However, in accordance with the present invention, the active signal is delayed, the bank is selected by the delayed bank address, and the delayed active signal is used as a precharge signal for the selected bank. Accordingly, it is not necessary that a plurality of delay units corresponding to the respective banks be provided.

In accordance with a third aspect of the present invention, there is provided a semiconductor memory device, including: a plurality of memory banks, each bank including a plurality of memory cells; a control circuit configured to generate a reference signal for a predetermined operation performed by each bank; and a delay circuit configured to delay the reference signal and a bank address by synchronizing the reference signal with the bank address, and outputs a delayed reference signal to a bank selected by a delayed bank address.

That is, it is not necessary that a plurality of delay circuits corresponding to the respective banks be provided. Instead, the delay circuit can be shared by the plurality of banks by synchronizing the bank address with the reference signal for the predetermined operation to delay the bank address and by providing the delayed reference signal for the predetermined operation to the bank selected by the delayed bank address. Accordingly, the size of the semiconductor memory device can be reduced.

DESCRIPTION OF SPECIFIC EMBODIMENTS

Hereinafter, a semiconductor memory device in accordance with the present invention will be described in detail with reference to the accompanying drawings.

Figure 2:
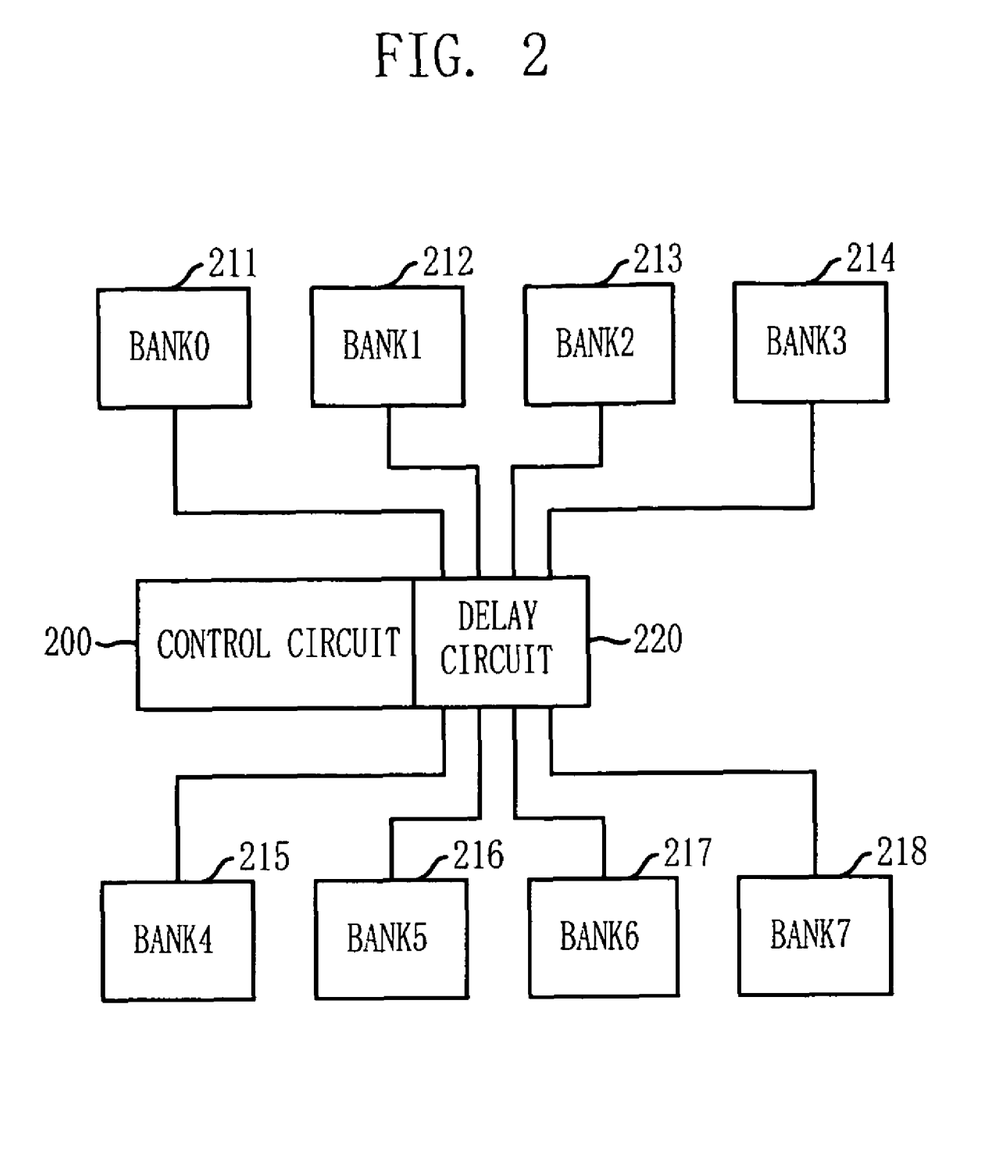
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device in accordance with the embodiment of the present invention includes a delay circuit 220 which is shared by a plurality of banks 211, 212, 213, 214, 215, 216, 217 and 218 to be used for predetermined operations of the plurality of banks 211 through 218. This is different from the typical semiconductor memory device including the plurality of delay circuits corresponding to respective banks shown in FIG. 1. For example, a semiconductor memory device including eight banks, if designed in accordance with the embodiment of the present invention, can reduce seven delay circuits in comparison with the typical semiconductor memory device.

Figure 3:
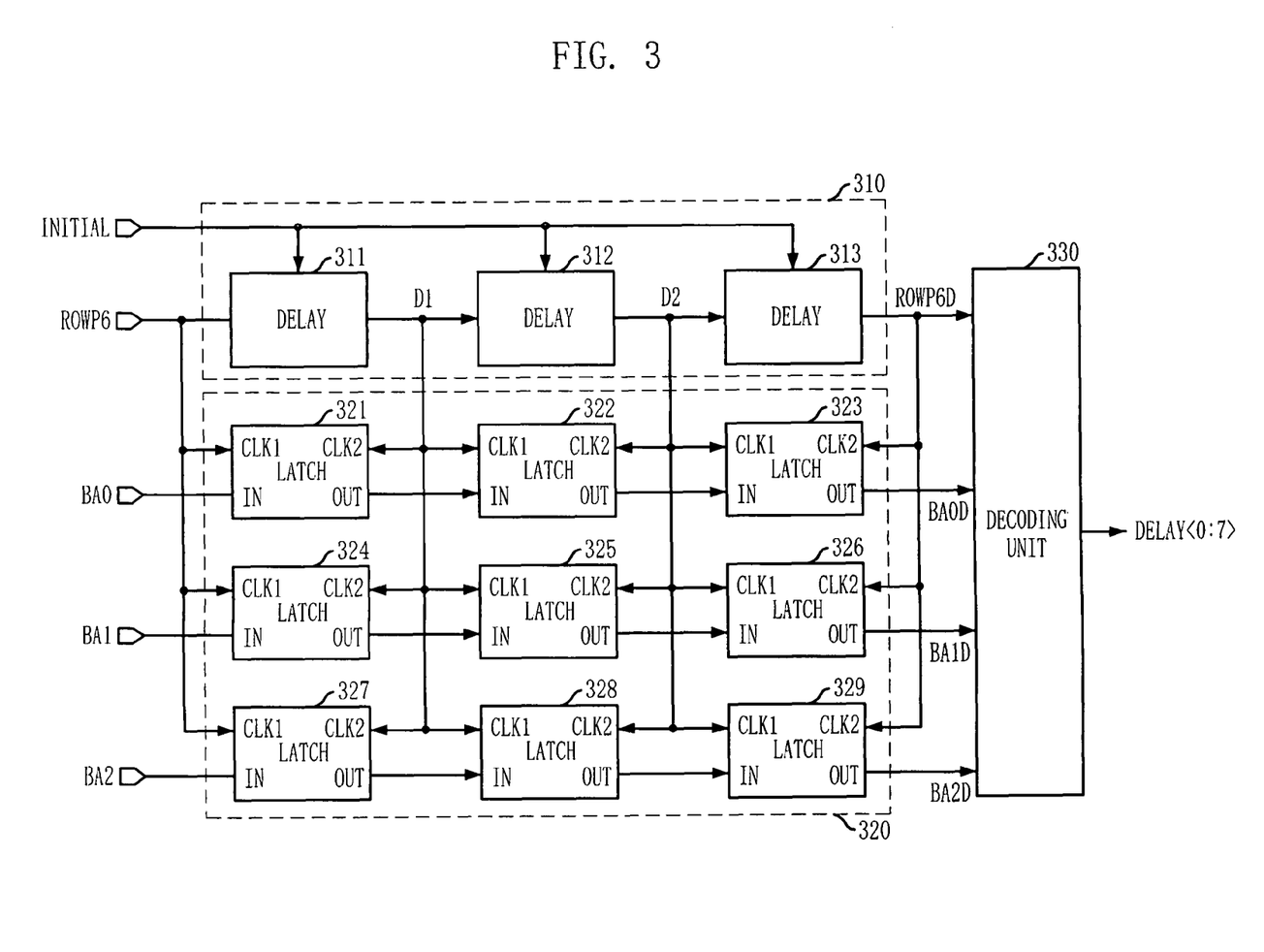
FIG. 3 is a block diagram of a delay circuit of a semiconductor memory device in accordance with an embodiment of the present invention.

FIG. 3 is a block diagram of a delay circuit of a semiconductor memory device in accordance with an embodiment of the present invention.

Referring to FIG. 3, the semiconductor memory device includes a reference signal delay unit 310, an address delay unit 320 and a decoding unit 330. The reference signal delay unit 310 delays a reference signal ROWP6 which serves as a reference for a predetermined operation to output a delayed reference signal ROWP6D. The address delay unit 320 delays bank addresses BA0, BA1 and BA2 to output delayed bank addresses BA0D, BA1D and BA2D. The decoding unit 330 receives the delayed reference signal ROWP6D to output one of delay signals DELAY<0:7>, each delay signal determining a timing for a predetermined operation on a bank designated by the delayed bank addresses BA0D, BA1D and BA2D.

The reference signal delay unit 310 delays the reference signal ROWP6 to output the delayed reference signal ROWPD6 which serves as a reference for a predetermined operation of each bank. It is not determined yet which bank will use the delayed reference signal ROWP6D. The predetermined operation includes a precharge operation performed by each bank in self/auto refresh modes. The precharge operation in each refresh mode is performed at a predetermined time interval, i.e., a time interval required for activating a device, after an active operation. Accordingly, precharge signals are generated by delaying an active signal. Hereinafter, the precharge signals will be given as an example of the delay signals DELAY<0:7>, and the active signal will be given as an example of the reference signal ROWP6.

The reference signal delay unit 310 may include a plurality of delays 311, 312 and 313 for delaying the active signal ROWP6 as shown in FIG. 3. An initial signal INITIAL inputted into the delays 311, 312 and 313 is a signal configured to initialize the delays 311, 312 and 313 and will be described later.

The address delay unit 320 delays the bank addresses BA0, BA1 and BA2 in synchronization with the active signal ROWP6. The synchronization is performed in order not to lose the bank addresses BA0, BA1 and BA2 corresponding to the active signal ROWP6 because the bank addresses BA0, BA1 and BA2 are changed in every active operation. The address delay unit 320 may include a plurality of latches 321, 322, 323, 324, 325, 326, 327, 328 and 329 for delaying the bank addresses BA0, BA1 and BA2. The latches 321 through 329 are opened and closed according to input/output signals of the plurality of delays 311, 312 and 313, i.e., the active signal ROWP6, first and second delay output signals D1 and D2 and the delayed active signal ROWP6D. The latches 321 through 329 correspond to respective bank addresses BA0, BA1 and BA2 as shown in FIG. 3.

The decoding unit 330 receives and decodes the delayed bank addresses BA0D, BA1D and BA2D. At the same time, the decoding unit 330 receives the delayed active signal ROWP6D to output a corresponding one of the precharge signals DELAY<0:7> determining a timing of the precharge operation to a bank selected by the decoded delayed bank addresses BA0D, BA1D and BA2D. For example, when the delayed bank addresses BA0D, BA1D and BA2D are all set to 0 and thus a first bank BANK0 is selected, the delayed active signal ROWP6D is outputted as a first precharge signal DELAY<0> to the first bank BANK0, which means that the first precharge signal DELAY<0> is activated and output at a time when the delayed active signal ROWP6D is activated. It should be noted also that the logic level of the first precharge signal DELAY<0> may be different from that of the delayed active signal ROWP6D. Similarly, when the delayed bank addresses BA0D, BA1D and BA2D are all set to 1 and thus an eighth bank BANK7 is selected, the delayed active signal POWP6D is outputted as an eighth precharge signal DELAY<7> to the eighth bank BANK7.

As described above, in accordance with the embodiment of the present invention, the reference signal delay unit 310 delays the active signal ROWP6. The address delay unit 320 delays the bank addresses BA0, BA1 and BA2 in synchronization with the active signal ROWP6. Then, the decoding unit 330 receives and decodes the delayed bank addresses BA0, BA1 and BA2D to select a bank and receives the delayed active signal ROWP6D to output corresponding one of the precharge signals DELAY<0:7> to the selected bank. That is, a plurality of banks share a single delay circuit for delaying the active signal ROWP6 to generate the precharge signals DELAY<0:7>. This is different from the typical semiconductor memory device where each bank delays the corresponding active signal to generate the corresponding precharge signal, separately.

Figure 4:
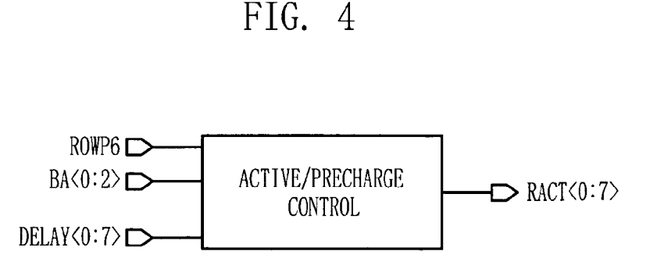
FIG. 4 illustrates how a precharge signal shown in FIG. 3 is used in the semiconductor memory device.

FIG. 4 illustrates how the precharge signals DELAY<0:7> shown in FIG. 3 are used in the semiconductor memory device.

Referring to FIG. 4, control signals RACT<0:7> are signals for controlling active/precharge operations of respective banks. For example, when a first control signal RACT<0> has a logic high level, the first bank BANK0 is enabled, and when a first control signal RACT<0> has a logic low level, the bank first BANK0 is precharged. The control signals RACT<0:7> are activated to a logic high level in response to the active signal ROWP6 and inactivated to a logic low level in response to one of the precharge signals DELAY<0:7>. When the bank addresses BA0, BA1, BA2 are all set to 0 and thus the first bank BANK0 is selected, the first control signal RACT<0> is activated as the active signal ROWP6 is activated to a logic high level and inactivated as the first precharge signal DELAY<0>, which informs the first bank BANK0 of its precharge point, is activated to a logic low level.

Figure 5:
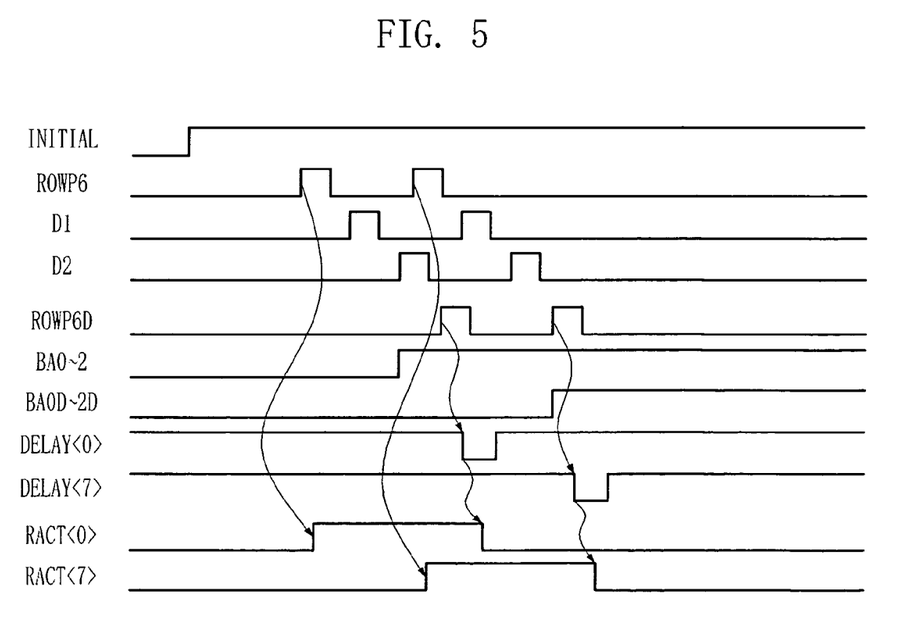
FIG. 5 is a timing diagram showing the delay circuit of the semiconductor memory device shown in FIGS. 3 and 4.

FIG. 5 is a timing diagram showing the delay circuit of the semiconductor memory device shown in FIGS. 3 and 4.

Referring to FIG. 5, at a first active operation when the active signal ROWP6, which is a kind of pulse, is activated for the first time, all bank addresses BA0, BA1 and BA2 are set to 0 and thus the first bank BANK0 is enabled. Accordingly, the first control signal RACT<0> becomes a logic high level. At a second active operation, all the bank addresses BA0, BA1 and BA2 are 1 and thus the eighth bank BANK7 is enabled. Accordingly, an eighth control signal RACT<7> becomes a logic high level.

In addition, when the delayed active signal ROWP6D which is delayed by the reference signal delay unit 310 becomes a logic high level for the first time, all delayed bank addresses BA0D, BA1D and BA2D which are delayed by the address delay unit 320 are set to 0. Accordingly, the decoding unit 330 outputs the first precharge signal DELAY<0> inactivated to a logic low level to the first bank BANK0. Then the first bank BANK<0> is precharged in response to the first precharge signal DELAY<0>. Accordingly, the first control signal RACT<0> becomes a logic low level. Similarly, when the delayed active signal ROWP6D becomes a logic high level for the second time, all the delayed bank addresses BA0D, BA1D and BA2D are set to 1. Accordingly, the decoding unit 330 outputs the eighth precharge signal DELAY<7> inactivated to a logic low level to the eighth bank BANK7 so that the eighth bank BANK7 is precharged. As a result, the eighth control signal RACT<7> becomes a logic low level.

The arrows shown in FIG. 5 indicate timing relations between signals.

Figure 6:
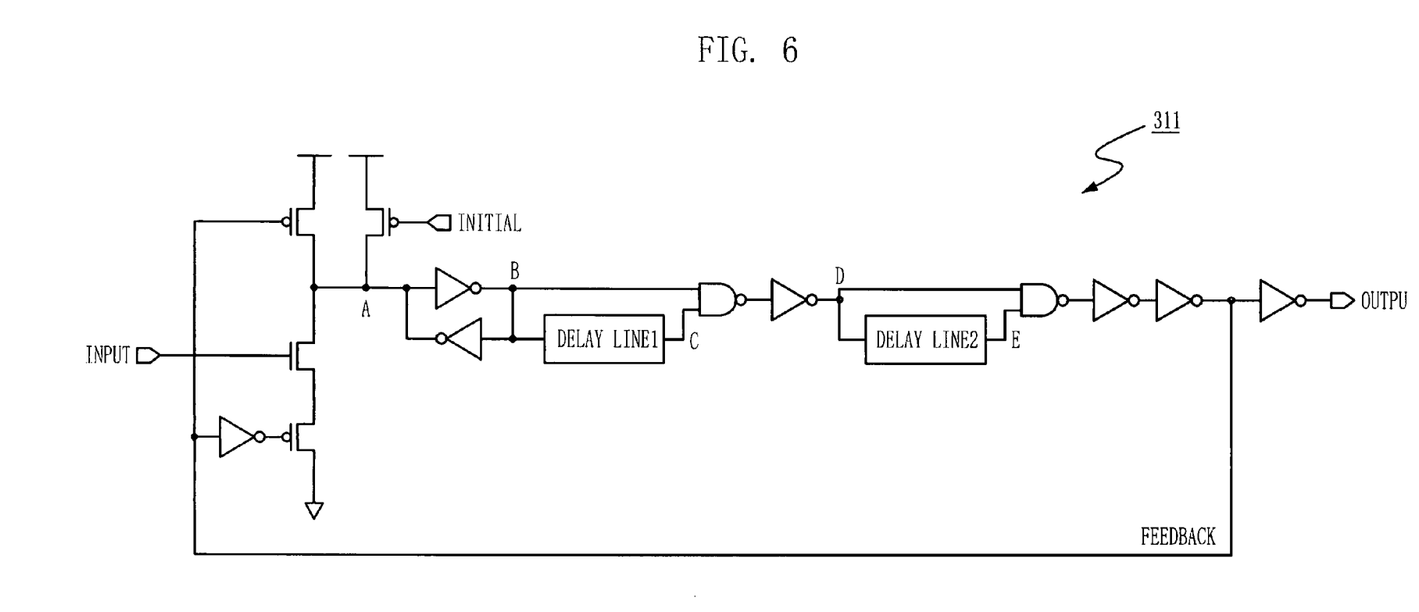
FIG. 6 is a circuit diagram of a delay of the delay circuit shown in FIG. 3.
Figure 7:
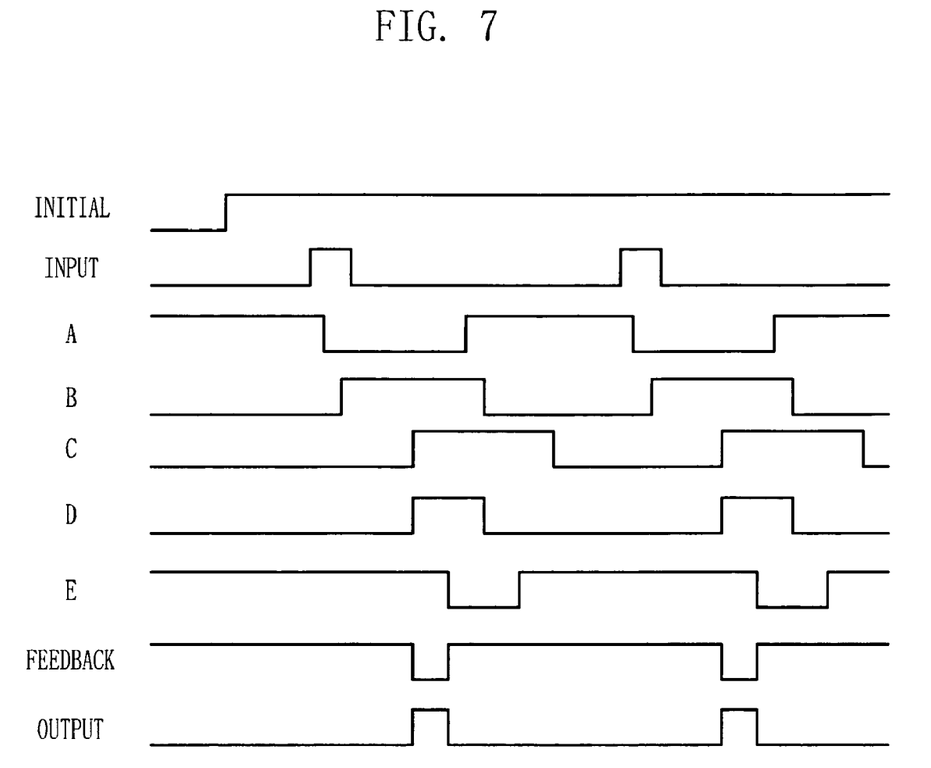
FIG. 7 is a timing diagram showing signals at nodes of the delay shown in FIG. 6.

FIG. 6 is a circuit diagram of the delay 311 of the delay circuit shown in FIG. 3, and FIG. 7 is a timing diagram showing signals at nodes of the delay 311 shown in FIG. 6.

The other delays 312 and 313 have substantially the same structure as that of the delay 311.

The delay 311 may perform a pulse width modulation as well as a signal delay as shown in FIG. 6. The pulse width modulation is performed when a pulse width of the precharge signals DELAY<0:7> generated by delaying the active signal ROWP6 is different from that of the delayed active signal ROWP6D. The pulse widths of the precharge signals DELAY<0:7> are determined by a delay value of a second delay line DELAY LINE2. As timings of logic levels of signals at nodes INPUT, A, B, C, D, E, FEEDBACK and OUTPUT of FIG. 6 are shown in FIG. 7, FIG. 6 is not described in more detail.

The initial signal INITIAL initializes a first node A and maintains a logic high level after a circuit starts as shown in FIG. 7.

Figure 8:
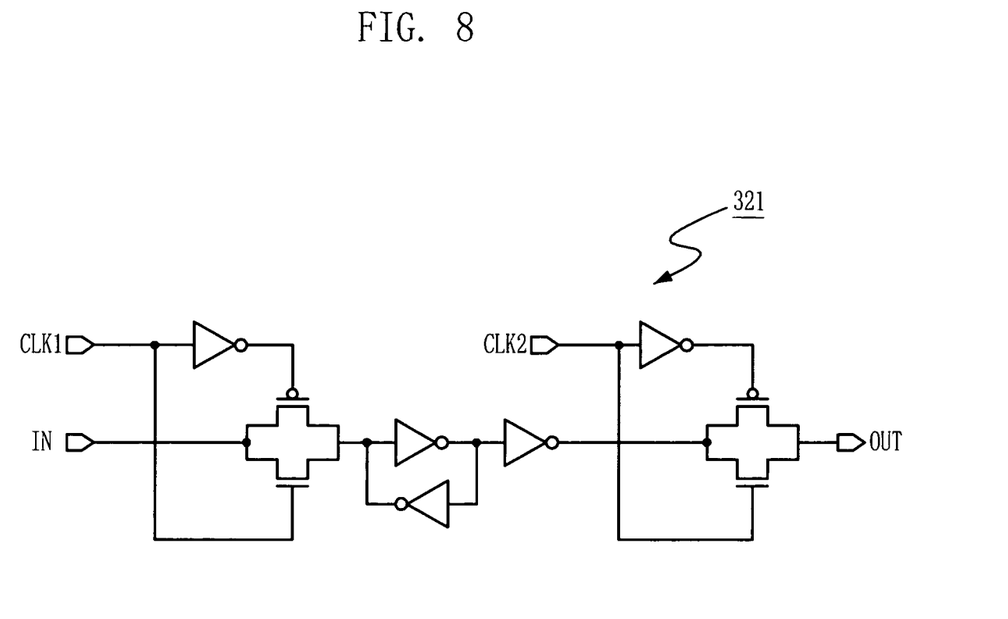
FIG. 8 is a circuit diagram of a latch of the delay circuit shown in FIG. 3.

FIG. 8 is a circuit diagram of the latch 321 of the delay circuit shown in FIG. 3.

The other latches 322 through 329 have substantially the same structure as that of the latch 321.

The latches 321 through 329 are opened and closed according to the input/output signals of the plurality of delays 311, 312 and 313, i.e., the active signal ROWP6, the first and second delay output signals D1 and D2 and the delayed active signal ROWP6D, and receive the bank addresses BA0, BA1 and BA2 to output the delayed bank addresses BA0D, BA1D and BA2D.

In detail, terminals CLK1 and CLK2 receive a corresponding one of the input/output signals of the plurality of delays 311, 312 and 313, and terminals IN and OUT receives a corresponding one of the bank addresses BA0, BA1 and BA2, and the delayed bank addresses BA0D, BA1D and BA2D. The bank addresses BA0, BA1 and BA2 inputted to the terminal IN are latched in synchronization with a signal of the terminal CLK1, and the latched bank addresses BA0, BA1 and BA2 outputted through the terminal OUT are latched in synchronization with a signal of the terminal CLK2. Accordingly, the bank addresses BA0, BA1 and BA2 inputted from and outputted into the latches 321 through 329 are synchronized with the active signal ROWP6 as they are delayed.

As described above, the semiconductor memory device in accordance with an embodiment of the present invention includes a delay circuit shared by a plurality of banks to be used for a predetermined operation of each of the plurality of banks such as a precharge operation. Therefore, the semiconductor memory device in accordance with the embodiment of the present invention can reduce its size in comparison with a typical semiconductor memory device including a plurality of delay circuits corresponding to the respective plurality of banks.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a plurality of memory banks, each bank including a plurality of memory cells;
   a control circuit configured to generate a reference signal for a predetermined operation performed by each bank; and
   a delay circuit configured to delay the reference signal and a bank address by synchronizing the reference signal with the bank address, and outputs a delayed reference signal to a bank selected by a delayed bank address.

2. The semiconductor memory device as recited in claim 1, wherein the delay circuit comprises:
   a reference signal delay unit configured to delay the reference signal to output the delayed reference signal;
   an address delay unit configured to delay the bank address to output the delayed bank address; and
   a decoding unit configured to receive the delayed reference signal to output a signal for determining a timing of a predetermined operation on a bank selected by the delayed bank address.

3. The semiconductor memory device as recited in claim 1, wherein the address delay unit is configured to delay the bank address in synchronization with the reference signal.

4. The semiconductor memory device as recited in claim 1, wherein the reference signal delay unit comprises a plurality of delays configured to delay the reference signal to output the delayed reference signal.

5. The semiconductor memory device as recited in claim 4, wherein the address delay unit comprises a plurality of latches configured to be opened and closed according to input and output signals of the plurality of delays to delay the bank address.

6. The semiconductor memory device as recited in claim 5, wherein the plurality of latches correspond to respective bank addresses.

7. The semiconductor memory device as recited in claim 1, wherein the reference signal generated by the control circuit is an active signal, and the delayed reference signal output from the delay circuit is a precharge signal.

* * * * *